United States Patent [19]

Dumbri et al.

[11] 4,260,909

[45] Apr. 7, 1981

[54] BACK GATE BIAS VOLTAGE GENERATOR CIRCUIT

[75] Inventors: Austin C. Dumbri, Easton; Walter Rosenzweig, Allentown, both of Pa.

[73] Assignee: Bell Telephone Laboratories, Incorporated, Murray Hill, N.J.

[21] Appl. No.: 937,951

[22] Filed: Aug. 30, 1978

[51] Int. Cl.$^3$ .......................... H03K 3/35; H03L 1/00; H03K 3/353

[52] U.S. Cl. ................................... 307/297; 307/304; 365/228

[58] Field of Search .................... 307/200 B, 296, 297, 307/304, 350, 362, 363; 365/95, 228, 229

[56] References Cited

U.S. PATENT DOCUMENTS

| | | | |
|---|---|---|---|
| 3,609,414 | 9/1971 | Pleshko et al. | 307/310 |
| 3,794,862 | 2/1974 | Jenne | 307/304 |
| 3,806,741 | 4/1974 | Smith | 307/304 |
| 4,004,164 | 1/1977 | Cranford, Jr. et al. | 307/297 |
| 4,016,434 | 4/1977 | DeFilippi | 307/297 |
| 4,049,980 | 9/1977 | Maitland | 307/304 |
| 4,068,134 | 1/1978 | Tobey, Jr. et al. | 307/297 |
| 4,115,710 | 9/1978 | Lou | 307/297 X |
| 4,142,114 | 2/1979 | Green | 307/304 |
| 4,156,153 | 5/1979 | Szechenyi | 307/200 B X |

OTHER PUBLICATIONS

Hummel, "Sentry Circuit for Substrate Voltage Control", *IBM Tech. Discl. Bull.*, vol. 15, No. 2, pp. 478–479, 7/1972.

Frantz, "Threshold Voltage Control for N-Channel MOSFET Devices", *IBM Tech. Discl. Bull.*, vol. 12, No. 12, p. 201, 5/1970.

Pleshko et al., "MOS Transistor Electronic Stabilization of Thresholds", *IBM Tech. Discl. Bull.*, vol. 10, No. 3, pp. 336–337, 8/1967.

Kubo et al., 1976 IEEE Int'l. Solid-State Circuits Conf., pp. 54–55, 2/18/76.

*Primary Examiner*—Larry N. Anagnos
*Attorney, Agent, or Firm*—Irwin Ostroff

[57] ABSTRACT

A back gate bias voltage generator circuit consists of three MOS transistors (Q4, Q5, Q6) with a separate load element (Q1, Q2, Q3) coupled to the drain of each and a voltage clamp (Q7) connected to an output terminal (16). A terminal at the potential of a power supply (VCC) serves as one input and a terminal at the substrate potential (VSub) serves as another input. When the power supply (VCC) potential and the substrate potential are within normal operating ranges, the output terminal (16) assumes a reference potential (VSS). The potential of the output terminal increases in magnitude if either of the two input potentials (VSS, VSub) goes outside preselected operating ranges.

9 Claims, 2 Drawing Figures

BACK GATE BIAS VOLTAGE GENERATOR CIRCUIT

TECHNICAL FIELD

This invention relates to voltage generator circuitry and, in particular, to a circuit for generating a back gate bias voltage for semiconductor devices of an integrated circuit when the main power supply used with the integrated circuit fails.

BACKGROUND OF THE INVENTION

Many of today's static n-channel MOS memory integrated circuits use only one power supply from which the substrate potential is created via an on-chip substrate voltage generator circuit. The substrate potential is the most negative potential used with the memory and results in a back gate bias on the MOS transistors which stabilizes threshold voltages and thus limits leakage caused by subthreshold conduction. Limiting subthreshold conduction is particularly important for memory cells in which the power dissipation is in the subnanowatt range. A failure of the power supply causes the substrate potential to also fail. Typically, an auxiliary power supply, such as a battery, is automatically substituted for the main power supply if there is a failure therein. This auxiliary power supply maintains the stored information in the memory and retains the substrate potential (provided the substrate voltage generator circuit is also connected to the battery) such that transistor back gate bias is maintained. In order to reduce power drain on the battery, all of the circuits (including the substrate voltage generator) of the memory other than the memory cells are disconnected from the battery. This results in increased subthreshold conduction through the MOS memory because of the loss of transistor back gate bias and can result in the loss of stored logic information.

In very low power dissipation static MOS memories a loss of transistor back gate bias can cause an increase in leakage currents due to increased subthreshold conduction which is comparable in magnitude to the quiescent current levels of the memory cells. As a result stored logic information is lost. The connecting of the battery to the substrate voltage generator circuit when the main power fails would improve the subthreshold conduction problem; however, power drain on the battery would be significantly increased.

SUMMARY OF THE INVENTION

A solution to the problem of maintaining back gate bias on switching devices of a semiconductor integrated circuit when a main power supply fails in accordance with the present invention is a circuit for providing control of the back bias voltage on semiconductor devices included in a semiconductor substrate including a gate circuit and BEING CHARACTERIZED IN THAT: the gate circuit (A, 24) comprises two input terminals and an output terminal (16); the first input terminal of the gate circuit (A, 24) is adapted to be coupled to a first power supply (VCC); the second input terminal of the gate circuit (A, 24) is adapted to be coupled to the substrate; the output terminal (16) of the gate circuit (A, 24) is adapted to be coupled to a terminal of the devices whose back bias voltage is to be controlled; and further characterized in that when potential levels of the substrate and the first power supply (VCC) are within preselected ranges then the potential of the output terminal (16) of the gate circuit (A, 24) is at a first potential level, and if either or both of the potentials of the power supply (VCC) or the substrate (VSub) are outside of the preselected ranges then the output terminal (16) of the gate circuit (A, 24) changes in potential to a second potential level which is greater in magnitude than the first potential level.

In one aspect the circuit of the present invention is essentially a two input NAND logic gate which uses a main power supply potential as one input voltage signal level and the voltage of the semiconductor substrate as a second input voltage signal level. The output terminal of the circuit, which is at a reference potential when the main power supply and substrate voltage are both within normal operating voltage limits, is pulsed in potential to a level sufficient to provide back gate bias on MOS transistors coupled to the output terminal if the main power supply or substrate potential should fall outside of the preselected voltage ranges. Power dissipation of the back gate bias voltage generator is relatively low such that the load on an auxiliary power supply (typically a battery) is low when the main power supply fails.

These and other features of the invention are better understood from a consideration of the following detailed description taken in conjunction with the accompanying drawing.

DETAILED DESCRIPTION

Figure 1:
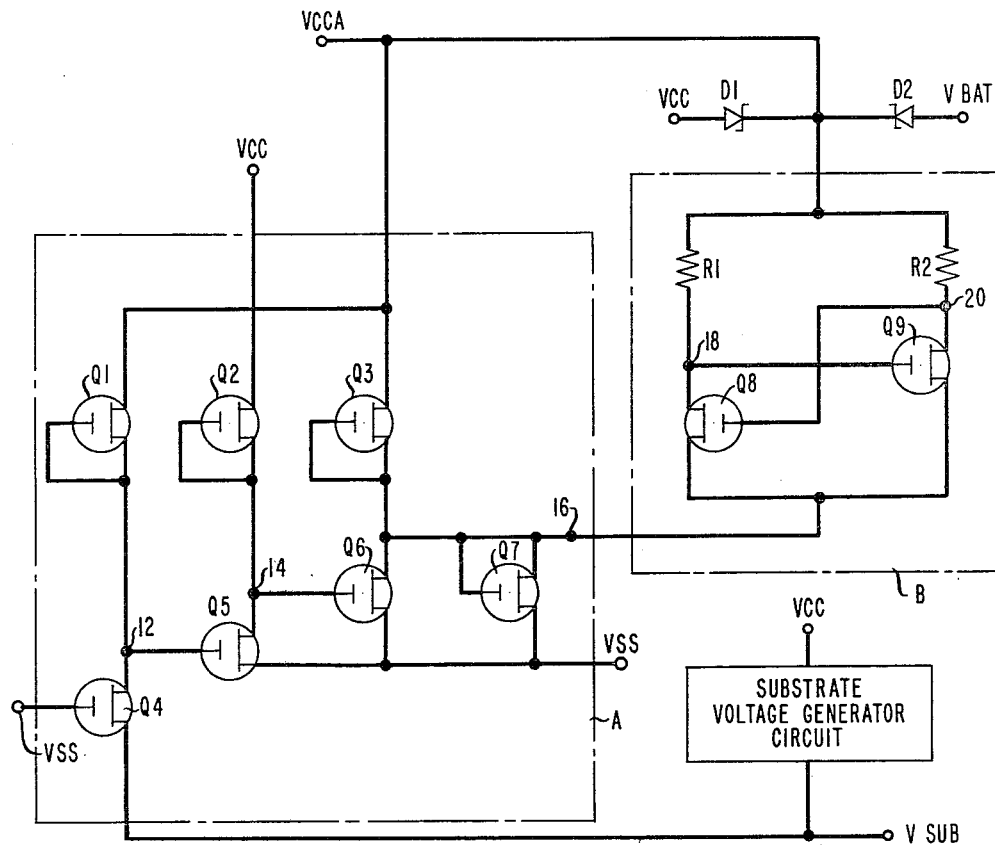
FIG. 1 illustrates a back gate bias voltage generator circuit in accordance with an illustrative embodiment of the invention with other circuits interconnected thereto.

Referring now to FIG. 1, there is illustrated, within dashed line rectangle A, a back gate bias voltage generator circuit comprising load elements Q1, Q2, and Q3 and MOS transistors Q4, Q5, Q6, and Q7. Q1, Q2, and Q3 are illustrated as MOS transistors and are in this illustrative embodiment depletion mode n-channel MOS transistors with the gate of each being coupled to the source. Q4, Q5, Q6 and Q7 are in this illustrative embodiment enhancement mode n-channel MOS transistors. Q1, Q2, and Q3 act essentially as load elements and could be replaced by passive resistive elements. The back gate bias voltage generator circuit contained within dashed line rectangle A is illustrated coupled to a memory cell contained within dashed line rectangle B, a substrate voltage generator circuit C, and two diodes D1 and D2.

The drain of Q2 is coupled to a terminal of a power supply VCC. The drains of Q1 and Q3 are coupled together to a terminal VCCA which is also coupled to the cathodes of diodes D1 and D2. The anode of D1 is coupled to the terminal of power supply VCC and the anode of D2 is coupled to a terminal of battery VBat. VCC is normally more positive in potential than VBat and, accordingly, VCCA normally follows the potential of VCC. If VCC should fail (fall to some potential below that of the VBat), then terminal VCCA follows the potential of VBat.

Terminal VCCA is also shown coupled to resistors R1 and R2 of an exemplary MOS static memory cell which is illustrated within dashed line rectangle B as also comprising cross-coupled n-channel enhancement mode MOS transistors Q8 and Q9. The gate of Q8 is coupled to R2, the drain of Q9, and to a terminal 20. The gate of Q9 is coupled to R1, the drain of Q8, and to a terminal 18. The sources of Q8 and Q9 are coupled together to a terminal 16, which serves as the output terminal of the back gate bias voltage generator circuit illustrated within dashed line rectangle A. Q8 and Q9 are intended to be representative of transistors whose back gate bias is to be controlled in accordance with the invention.

Logic information is stored in the memory cell as a function of the presence or absence of current flow through R1 or R2. If current flows through R1 then terminal 20 is at a low potential level, a "0". Correspondingly, there is essentially no current flow through R2, except for leakage current and, accordingly, terminal 18 is at a high potential level, a "1". A conventional substrate voltage generator circuit C utilizes VCC as an input and creates a potential VSub therefrom which is coupled to the semiconductor substrate of the memory cell and to the source of Q4. A typical embodiment of a substrate voltage generator circuit is described in U.S. Pat. No. 3,806,741.

A plurality of memory cells of the type illustrated within dashed line rectangle B are all typically fabricated simultaneously in a single semiconductor substrate together with access, input/output, read, and write circuitry (all not illustrated) and a substrate voltage generator circuit C to form a static MOS Random Access Memory (RAM). The substrate potential is generally the most negative potential used with the memory and results in a back gate bias on Q8 and Q9.

As will become clear later in this description, the back gate bias voltage generator circuit contained within dashed line rectangle A is adapted to provide an output voltage at terminal 16 which is essentially equal to a reference potential VSS (typically ground potential) when VCC and VSub are within preselected voltage limits. Terminal 16 assumes a potential which is the threshold voltage of Q7 above VSS if VCC or VSub change in potential to levels outside the preselected limits. This results in the desired back gate bias on Q8 and Q9 if VCC and/or VSub should fail.

When VCC fails there is a subsequent failure in VSub. Thus, but for the presence of the back gate bias voltage generator circuit of the present invention, the back gate bias on Q8 and Q9 goes to zero and the threshold voltages of Q8 and Q9 decrease when VCC fails. This results in an increase in conduction in the transistor of the memory cell which is conducting (in the "on" state) and causes additional leakage current because of increased subthreshold conduction to flow through the other transistor which is supposed to be nonconducting (in the "off" state). The increase in leakage current through the nonconducting transistor can cause the total current flow therethrough to be essentially the same as the quiescent current flow which is indicative of a stored "1". In such a case the memory cell has lost the stored information. The back gate bias generator circuit causes an increase in the potential of terminal 16 to a value of one threshold above VSS if VCC or VSub fails. This provides a back gate bias on Q8 and Q9 of at least the magnitude of the threshold voltage of Q7. This back gate bias serves to help inhibit subthreshold conduction and thus helps to maintain logic information stored in the memory cell if VCC and/or VSub fails.

The gate and source of Q1, the drain of Q4, and the gate of Q5 are all coupled together to terminal 12. The gate of Q4 and the sources of Q5, Q6, and Q7 are all coupled together to a reference potential VSS. The gate and source of Q2, the drain of Q5, and the gate of Q6 are all coupled together to a terminal 14. The gate and source of Q3, the gate and drain of Q7, and the drain of Q6 are all coupled together to output terminal 16. The source of Q4 is coupled to the potential VSub. The source of Q4 can also be connected to the substrate of the memory.

In one set of typical operating conditions, VCC = +5.0 volts, VBat = +3.6 volts, D1 and D2 are Schottky barrier diodes with a +0.4 volt forward voltage drop each, the generated substrate voltage is approximately −2.8 volts, and VCCA is at a potential of approximately 4.5 volts with VCC = +5.0 volts. If VCC fails (drops to a value of less than +3.6 volts), then VCCA assumes a potential of approximately +3.2 volts and the output of substrate voltage generator circuitry C drops to a value near ground potential.

The ratios of geometries of transistor Q1 to Q4, Q2 to Q5, and Q3 to Q6 are selected such that essentially the potentials coupled to the sources of Q4, Q5, and Q6 appear on the drains when Q4, Q5, and/or Q6 are enabled (biased on). Under all operating conditions Q1, Q2, and Q3 are biased so as to facilitate conduction between drain and source. With the above-described operating conditions, Q1 and Q4 are enabled (biased on) and terminal 12 assumes a potential of VSub (approximately −2.8 volts). This maintains Q5 disabled (biased off) and thus terminal 14 is set to the potential of approximately VCC (+5.0 volts). This enables Q6 and the potential of terminal 16 assumes a value close to VSS (zero volts). At this point in time Q7 is disabled. The substrate has a potential of −2.8 volts and the sources of Q8 and Q9 are at 0 volts. There is thus 3.8 volts of back gate bias on Q8 and Q9.

If VCC goes to zero volts, terminal 14 goes to zero volts and thereby disables Q6. The potential of terminal 16 rises until it reaches a value of the threshold voltage of Q7 above VSS. Q7 then becomes enabled and serves as a voltage regulator which limits the voltage of terminal 16 from rising further.

If the VSub goes to zero volts, then Q4 becomes disabled and the potential of terminal 12 rises to that of VCCA (approximately +3.2 to +3.6 volts). This enables Q5 which, in turn, causes the potential of terminal 14 to drop to VSS (zero volts) and thereby disables Q6. The potential of terminal 16 rises until it reaches a value of the threshold voltage of Q7 above VSS. Q7 then becomes enabled and serves as a voltage regulator which limits the voltage of terminal 16 from rising further.

Accordingly, if VCC or VSub go to zero volts, terminal 16 assumes a potential of VSS plus the threshold voltage of Q7. This results in a back gate bias voltage between the sources of Q8 and Q9 and the substrate having a magnitude of the threshold voltage of Q7. Typically the threshold voltage of Q7 is one volt.

If VCC and VSub now both assume the proper preselected potential levels, then Q4 is enabled and terminal 12 assumes a potential of approximately −2.8 volts. This disables Q5 and thus terminal 14 assumes a potential of VCC. This in turn enables Q6, which causes terminal 16 to assume a potential of approximately that of VSS. R1 and R2 are both at VCC −0.4 volt, the sources of Q8 and Q9 are both at VSS, and the substrate is at −2.8 volts. These are the normal operating potentials of the memory cell.

The back gate bias voltage generator circuit illustrated within dashed line rectangle A of FIG. 1 has been fabricated on the same semiconductor substrate as a 4096 Bit n-channel MOS static RAM. The total power dissipation necessary to maintain stored logic information in all the 4096 memory cells is approximately $2 \times 10^{-6}$ watts. The power dissipation of the back gate bias voltage generator circuit is typically $5 \times 10^{-6}$ watts. This is compared to a typical substrate voltage generator circuit C which dissipates three orders of magnitude more power.

Figure 2:
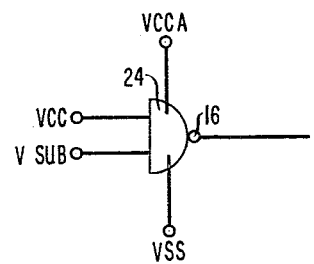
FIG. 2 illustrates another back gate bias voltage generator circuit in accordance with another illustrative embodiment of the invention.

It is to be appreciated that the back gate bias circuit contained within dashed lined rectangle A of FIG. 1 acts essentially as a two input gate with the first input being VCC and the second input being VSub. If VCC and VSub are within the normal operating potential ranges, input "1s", then the output potential of terminal 16 is at a reference level, an output "0". If VCC and/or VSub are outside the normal operating potential ranges, an input "1" and an input "0" or two input "0s", then the potential at terminal 16 increases to a potential greater in magnitude than the reference potential, an output "1". One type of logic gate which has the above-described characteristics is illustrated in FIG. 2 as a two input NAND gate 24. VCC and VSub serve as the two inputs and the output is terminal 16. Power is supplied to NAND gate 24 via terminals VCCA and VSS.

It is to be appreciated that NAND gate 24 may be implemented in many ways with a variety of different circuit configurations other than the specific embodiment illustrated in FIG. 1.

Some semiconductor integrated circuits use a separate external power supply connected to the substrate instead of an on-chip substrate voltage generator circuit. The external power supply is in addition to at least one other external supply which is used to supply power to the circuit. The circuit of the present invention is functional if the substrate potential is generated on-chip or supplied from an external power supply.

If VCC and VSub are both created from separate power supplies, and a one volt threshold is assumed for Q4, Q5, Q6, and Q7, then VCC can drop from +5 volts to +1 volt and VSub can increase from −2.8 volts to −1 volt and terminal 16 stays at essentially VSS (0 volts-ground potential). Generally, with VCC used to generate VSub, if VCC becomes more positive in potential, then VSub becomes more negative in potential. The circuit of the present invention continues to be functional if VCC becomes more positive than +5 volts and/or if VSub becomes more negative than −2.8 volts.

The embodiments described herein are intended to be illustrative of the general principles of the present invention. Various modifications are possible consistent with the spirit of the invention. For example, the load elements can be p-n diodes, enhancement mode n-channel MOS transistors with the gate of each coupled to the drain, or can be resistors. Still further, p-channel enhancement mode MOS transistors can be substituted for the n-channel enhancement mode MOS transistors and p-channel depletion or enhancement mode MOS transistors can be substituted for the n-channel depletion mode MOS transistors provided the voltage polarities are appropriately changed. Still further, transistor Q7 could be replaced by a p-n diode or by a resistor. The ratio of the value of the resistor to the resistance of Q3 should be selected such that terminal 16 reaches a potential of approximately one to two volts when Q6 is disabled. Still further, the circuit of the present invention can be separate from the integrated circuit which has the switching device(s) which are to be protected from a loss in back gate bias. Finally, the present invention may be used with circuits other than memories.

We claim:

1. A circuit for providing control of the back bias voltage on semiconductor devices included in a semiconductor substrate including a gate circuit and being characterized in that:

the gate circuit (A, 24) comprises two input terminals and an output terminal (16);

the first input terminal of the gate circuit (A, 24) is couplable to a first power supply (VCC);

the second input terminal of the gate circuit (A, 24) is couplable to the substrate;

the output terminal (16) of the gate circuit (A, 24) is couplable to a non-substrate terminal of the devices whose back bias voltage is to be controlled;

and further characterized in that when potential levels of the substrate and the first power supply (VCC) are within preselected ranges then the potential of the output terminal (16) of the gate circuit (A, 24) is at a first potential level, and if either or both of the potentials of the power supply (VCC) or the substrate (VSub) are outside of the preselected ranges then the output terminal (16) of the gate circuit (A, 24) changes in potential to a second potential level which is different than the first potential level and which increases the back bias voltage on the semiconductor devices.

2. The circuit of claim 1 being further characterized by a substrate generator circuit (C) which is formed on the semiconductor substrate and which is couplable to the first power supply and to generate a potential (VSub) which is applied to the substrate.

3. The circuit of claim 2 characterized in that the gate circuit (A, 24) is a two input NAND logic gate (A, 24).

4. Circuitry for providing control of the back gate bias voltage of semiconductor devices formed on a common semiconductor substrate including first, second, and third switching devices (Q4, Q5, and Q6) each having a control terminal and a first and second output terminal, first, second, and third load elements (Q1, Q2, and Q3) each having first and second terminals, the first output terminal of the first switching device (Q4) being coupled to the first terminal of the first load element (Q1), and to the control terminal of the second switching device (Q5), and to a first terminal (12), the first output terminal of the second switching device (Q5) being coupled to the control terminal of the third switching device (Q6), and to the first terminal of the second load element (Q2), and to a second terminal (14), the first output terminal of the third switching device (Q6) being coupled to the first terminal of the third load device (Q3), and to a third terminal (16), and being characterized by:

voltage limiting means (Q7) coupled to the third circuit terminal (16) which serves as an output terminal;

the second terminals of the first and third load elements (Q1, Q3) being coupled together to a fourth terminal (VCCA);

the second terminal of the second load element being coupled to a fifth circuit terminal (VCC) which serves as a first input terminal and which is not directly connected to the fourth terminal;

the second output terminal of each of the second and third switching devices (Q5, Q6) being coupled together to a sixth terminal (VSS); and the second output terminal of the first switching device (Q4) being coupled to the substrate which serves as a second input terminal.

5. The circuitry of claim 4 characterized in that the voltage limiting means (Q7) is a fourth switching device having a control terminal and a first output terminal which are both coupled to the third terminal (16) and having a second output terminal which is coupled to the sixth terminal (VSS).

6. The circuitry of claim 5 characterized in that the first, second, third and fourth switching devices (Q4, Q5, Q6, Q7) are n-channel MOS transistors.

7. The circuitry of claim 6 characterized in that:

the first, second and third load elements (Q1, Q2, Q3), are separate switching devices which each have a control terminal, a first output terminal, and a second output terminal;

the control terminal and the first output terminal of the first switching device load element (Q1) being coupled to the first terminal (12);

the control terminal and the first output terminal of the second switching device load element (Q2) being coupled to the second terminal (14); and the control terminal and the first output terminal of the third switching device load element (Q3) being coupled to the third terminal (16).

8. The circuitry of claim 7 characterized in that:

the first, second, third, and fourth switching devices (Q4, Q5, Q6, Q7) and the first, second, and third switching device load elements (Q1, Q2, Q3) are first, second, third, fourth, fifth, sixth, and seventh MOS transistors (Q4, Q5, Q6, Q7, Q1, Q2, Q3), respectively.

9. The circuitry of claim 8 characterized in that:

the first, second, third, and fourth MOS transistors (Q4, Q5, Q6, Q7) are enhancement mode n-channel transistors; and the fifth, sixth and seventh MOS transistors (Q1, Q2, Q3) are depletion mode n-channel transistors.

* * * * *